United States Patent
Otake et al.

(10) Patent No.: US 9,481,855 B2
(45) Date of Patent: Nov. 1, 2016

(54) CLEANING COMPOSITION AND METHOD FOR CLEANING A SEMICONDUCTOR DEVICE SUBSTRATE AFTER CHEMICAL MECHANICAL POLISHING

(71) Applicant: EKC Technology, Inc., Hayward, CA (US)

(72) Inventors: Atsushi Otake, Tokyo (JP); Akira Kuroda, Kanagawa (JP)

(73) Assignee: EKC TECHNOLOGY INC, CA (US)

( * ) Notice: Subject to any disclaimer, the term of this patent is extended or adjusted under 35 U.S.C. 154(b) by 484 days.

(21) Appl. No.: 14/026,924

(22) Filed: Sep. 13, 2013

(65) Prior Publication Data

US 2014/0076365 A1    Mar. 20, 2014

Related U.S. Application Data

(60) Provisional application No. 61/702,056, filed on Sep. 17, 2012.

(51) Int. Cl.
| | |
|---|---|
| *C11D 3/00* | (2006.01) |
| *H01L 21/02* | (2006.01) |
| *C11D 7/32* | (2006.01) |
| *C11D 11/00* | (2006.01) |

(52) U.S. Cl.
CPC .......... *C11D 3/0073* (2013.01); *C11D 7/3218* (2013.01); *C11D 7/3281* (2013.01); *C11D 11/0047* (2013.01); *H01L 21/02068* (2013.01); *H01L 21/02074* (2013.01)

(58) Field of Classification Search
CPC ................................................. C11D 11/0047
See application file for complete search history.

(56) References Cited

U.S. PATENT DOCUMENTS

| | | |
|---|---|---|
| 2004/0029051 A1 | 2/2004 | Koita et al. |
| 2009/0239777 A1 | 9/2009 | Angst et al. |
| 2012/0048295 A1* | 3/2012 | Du .................. C11D 7/3245 134/3 |

FOREIGN PATENT DOCUMENTS

| | | |
|---|---|---|
| JP | 2010-287751 | 12/2010 |
| JP | 2012-107226 | 6/2012 |
| KR | 10-2009-0032640 | 4/2009 |
| KR | 10-2011-0086092 | 7/2011 |

OTHER PUBLICATIONS

International Search Report and Written Opinion (PCT/US2013/060034); Nov. 22, 2013.

* cited by examiner

*Primary Examiner* — Gregory Webb
(74) *Attorney, Agent, or Firm* — Simon L. Xu

(57) ABSTRACT

An aqueous cleaning composition and method for post-CMP cleaning of a semiconductor device which contains a copper interconnect wherein the cleaning composition contains (A) N,N,N'-trimethyl-N'-(2-hydroxyethyl)ethylenediamine; and (B) at least one corrosion inhibitor selected from the group consisting essentially of uric acid, xanthine, theophyline, paraxanthine, theobromine, caffeine, guanine, hypoxanthine, adenine, and combinations thereof.

4 Claims, 4 Drawing Sheets

CLEANING COMPOSITION AND METHOD FOR CLEANING A SEMICONDUCTOR DEVICE SUBSTRATE AFTER CHEMICAL MECHANICAL POLISHING

CROSS REFERENCE TO RELATED APPLICATIONS

This application claims benefit of U.S. Provisional Application Ser. No. 61/702,056, filed on Sep. 17, 2012, the entire contents of which are hereby expressly incorporated herein by reference.

FIELD OF THE INVENTION

The present invention relates generally to cleaning a semiconductor device substrate which contains copper interconnects, and, more particularly, the described and claimed inventive concept(s) relate to removing residues which remain on the semiconductor device substrate and copper interconnect after Chemical Mechanical Polishing. The inventive concept(s) reside in a cleaning method and composition comprising i) N,N,N'-trimethyl-N'-(2-hydroxyethyl)ethylenediamine and ii) a dynamic corrosion inhibitor which protects the copper interconnect surfaces in liquid phase and leaves virtually no detectable coating after rinsing with deionized water.

BACKGROUND OF THE INVENTION

Chemical Mechanical Polishing, or Chemical Mechanical Planarization, (CMP) is used in the manufacture of advanced semiconductor devices which contain copper interconnects. Copper has become the material of choice for the interconnects in advanced semiconductor devices due to its low resistance and ease of processing. Device fabrication with copper requires electrochemical deposition and CMP. Since the polished copper surface generated during CMP is considered to be one of the most important factors which determine the performance of the interconnects, post-CMP cleaners must efficiently remove any residues that may be generated by the polishing process. Thus, CMP slurries and post-CMP cleaners frequently include one or more corrosion inhibitors which are selected to form a temporary protective layer on the copper interconnect surface. However, if an organic film should remain on the copper interconnect surface after the cleaning process, the presence of such a film can interfere with subsequent steps, e.g., chemical vapor deposition (CVD), and with the ultimate performance of the copper interconnect. In post CMP cleaning processes, therefore, it is an important objective to have low organic residue(s) remaining on the copper surfaces and low corrosion of the copper interconnect. A conventional corrosion inhibitor, such as, for example, benzotriazole (BTA) can suppress corrosion of copper in a semiconductor device. However, BTA, and corrosion inhibitors of that type, will typically leave a hydrophobic layer on the copper surfaces which, in turn, contributes to formation of undesirable high organic residues. In addition, a conventional amine, such as, for example, 2-aminoethanol, can remove organic residues from the copper surface, but conventional amines have also been observed to etch the copper interconnect surface thereby creating corrosion defects. A slurry comprising a solution of an abrasive and an active chemistry yields a unique and even synergistic combination of physical and chemical action that can preferentially remove complex layers of metals and other undesirable materials from a wafer surface in preparation for subsequent patterning, etching and thin-film processing.

Accordingly, there remains a need for a cleaning composition capable of providing post-CMP cleaning of a semiconductor device which contains copper interconnects and that not only removes organic residue(s), but also minimizes copper corrosion.

SUMMARY OF THE INVENTION

In accordance with an embodiment of the invention, a cleaning composition is provided for post-CMP cleaning of a semiconductor device which contains copper interconnect(s). The composition comprises at least:

(A) from about 0.1 wt % to about 20 wt % N,N,N'-trimethyl-N'-(2-hydroxyethyl)ethylenediamine; and (B) from about 0.01 wt % to about 10 wt % of at least one corrosion inhibitor selected from the group consisting essentially of uric acid, xanthine, theophylline, paraxanthine, theobromine, caffeine, guanine, hypoxanthine, adenine, and combinations thereof.

In a preferred embodiment, based on consistent performance and cost effectiveness, the corrosion inhibitor is xanthine.

In accordance with another embodiment, the composition further comprises from about 0.01 wt % up to 20 wt % of tris(2-hydroxyethyl)methylammonium hydroxide (THEMAH). The described and claimed inventive concept(s) provide an alkaline post-CMPO cleaning composition which demonstrates enhanced cleaning efficiency on microelectronic devices having one or more copper interconnects while simultaneously protecting the copper from corrosion during the cleaning process. The cleaning composition can then be removed by rinsing with deionized water.

In accordance with other embodiments of the invention, the alkaline cleaning composition can be used in post-CMP cleaning of semiconductor devices which contain copper interconnects, and further can be used in a method to reduce copper corrosion during semiconductor device fabrication. Good results have been observed when the pH of the composition is in the range of from about 8.5 to as high as 13, but best results have been observed when the pH of the composition is between about 11 and 12.5.

DETAILED DESCRIPTION OF THE INVENTION

Figure 1:
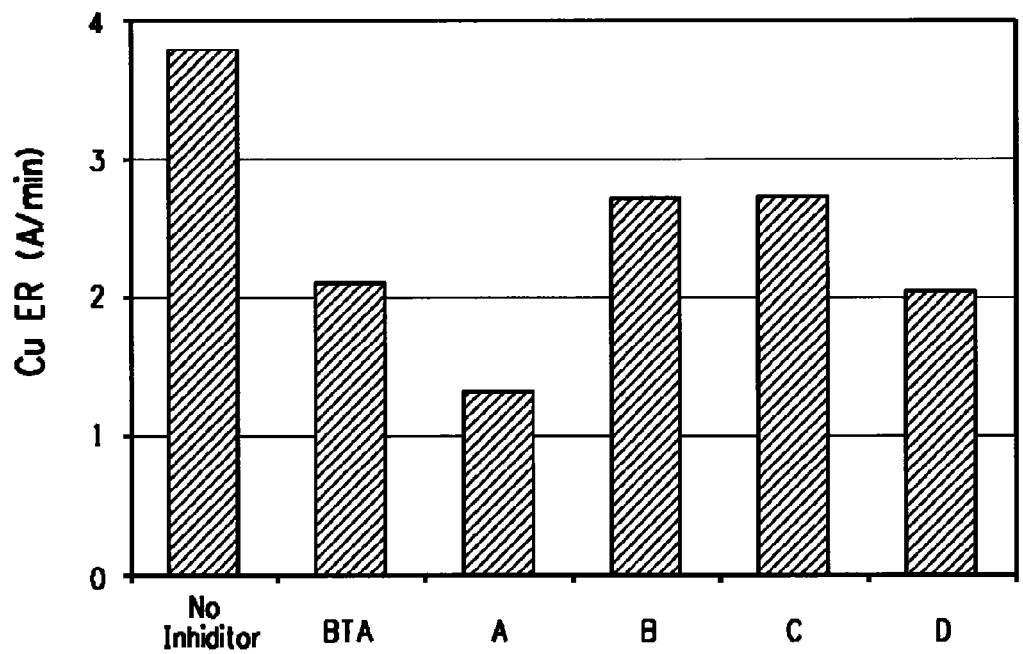
FIG. 1 is a graph which compares copper etch rates for various alkaline post-CMP cleaning solutions with corrosion inhibitors.

A semiconductor device which can include copper containing components can be cleaned following Chemical Mechanical Polishing (CMP) with an alkaline cleaning composition which comprises at least:

(A) from about 0.1 wt % to about 20 wt % N,N,N'-trimethyl-N'-(2-hydroxyethyl)ethylenediamine; and (B) from about 0.01 wt % to about 10 wt % of at least one corrosion inhibitor selected from the group consisting of uric acid, xanthine, theophylline, paraxanthine, theobromine, caffeine, guanine, hypoxanthine, adenine, and combinations thereof.

The balance of the cleaning composition will comprise de-ionized water and one or more other components, including from about 0.01 wt % up to 20 wt % of tris(2-hydroxyethyl)methylammonium hydroxide (THEMAH), depending on the structural materials comprising the semiconductor device being fabricated. In a preferred embodiment the corrosion inhibitor is xanthine, and the composition includes from about 0.01 wt % up to 20 wt % of tris(2-hydroxyethyl)methylammonium hydroxide.

In accordance with another embodiment, the cleaning composition can have a pH of from about 8.5 to as high as 13, but preferably for best residue removal the pH of the composition will be between about 11 and 12.5.

In accordance with another embodiment of the invention, a method of cleaning a semiconductor device post-CMP is provided which comprises contacting the semiconductor device surface after CMP with the above described alkaline cleaning composition for a period of time from 5 seconds to about 10 minutes and at a temperature of from 20° C. up to 90° C.

In accordance with another embodiment of the invention, a method for reducing copper corrosion during semiconductor device fabrication is provided which comprises cleaning the semiconductor device after CMP by contact with the above described cleaning composition for a period of time from 5 seconds to about 10 minutes and at a temperature of from 20° C. up to 90° C.

The term "semiconductor device" as used herein is intended to embrace microelectronic device wafers which are used to form integrated circuits. A microelectronic device wafer includes a substrate, such as, for example, silicon, onto which regions are patterned for deposition of a variety of different materials having insulative, conductive and/or semi-conductive properties.

In copper damascene processes commonly used for metallization of circuitry in microelectronic device fabrication, the layers that must be removed and planarized, i.e., polished, include copper layers, or lines, having a thickness of from 1 to 1.5 microns and copper seed layers having a thickness of from 0.05 to 0.15 microns. The copper layers are separated from dielectric surface material by a layer of barrier material. A key to obtaining good uniformity across the wafer surface after polishing is to use a post-CMP cleaning composition that has the appropriate chemistry for removal selectivities for each kind of residue material that may remain.

The term "residue" is used herein to mean small particles, foreign material and any type of debris that is left behind on a wafer surface that is generated during any or all of the typical microelectronic device fabrication steps, which can include plasma etching, ashing, CMP, wet etching, post-CMP cleaning, and combinations thereof. The size of residue particles can vary from several microns in size down to extremely small particles, e.g., molecules.

The term "post-CMP residue" is used herein to mean and include all of the types of particles that are typically generated because of the chemistry selected for the CMP polishing slurry. These particles can include reaction by-products of the polishing slurry, chemicals from wet etching and their reaction by-products, and other materials that are by-products from the various device fabrication steps, such as plasma etching or the plasma ashing process.

Barrier materials, e.g., tantalum, titanium, ruthenium, cobalt, hafnium and the like, are used to seal the copper metal lines and thereby prevent diffusion of the copper into the dielectric material. They can also leave behind an undesirable residue that must be taken into account in designing the cleaning formulation.

The presently described and claimed inventive concept(s) define a composition and method including a dynamic corrosion inhibitor that will provide a temporary protective coating on a copper surface, but leave virtually no detection coating after rinsing with deionized water. The presence of a protective coating can be detected by electrochemical measurement. The term "no detectable coating", or "virtually no detectable coating, is used herein to mean removal of the temporary protective coating to an extent that it is no longer capable of being detected by electrochemical measurement. The term "electrochemical measurement" is used herein to mean electrochemical impedance spectroscopy described in the following experimental section.

The compositions described herein may be embodied in a wide variety of specific formulations which may include one or more antioxidants, one or more solvents, one or more quaternary bases, one or more additional organic amines, one or more surfactants, and the like, depending on the composition of the structural components of the microelectronic device being fabricated and specific device fabrication steps. A description of typical formulation components beyond the described and claimed inventive concept(s) set forth herein can be found, for example, in Published U.S. Patent Application No. 2009/0133716 A1, the teachings of which are incorporated herein by reference in their entirety.

The compositions described herein can be applied to remove unwanted residues from a semiconductor device surface by any suitable method or manner. For example, the composition can be sprayed onto the device surface to be cleaned, or the device can be dipped into a volume of the cleaning composition for a period of time from 5 seconds to about 10 minutes at ambient, i.e., room, temperature, although the temperature can range from 20° C. up to 90° C. The device to be cleaned can also be contacted with a fibrous sorbent pad which has been saturated with the cleaning solution, or by any other suitable means, such as, for example, a wafer scrubber system. Following contact with the cleaning solution, the device is thoroughly rinsed with deionized water.

The compositions describes herein can be further diluted with, for example, deionized water, prior to contacting the semiconductor device surface. In other embodiments the cleaning agent or compositions are diluted before use or replenished during or after use wherein up to 500 parts water is added to the composition within about one day prior to contacting a substrate to be cleaned with the resulting mixture. At other times the dilution water can be added to the composition within about one hour prior to contacting the substrate with the resulting mixture. Satisfactory results have been observed with composition dilution factors of from about 10 to about 500.

EXAMPLES

All chemicals used for preparing the examples which follow are commercially available unless otherwise mentioned. A commercial alkaline copper post-CMP cleaner, EKC™ PCMP5600, (available from EKC Technology, Inc.) was used as a reference solution.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Unless expressly stated otherwise, the term "about" as used herein is intended to include and take into account variations due to manufacturing tolerances and/or variabilities in process control.

Copper Etch Rate—

Copper thickness was measured for the test samples using an automated sheet resistivity meter, 280P (Four Dimensions, Inc.). Copper etch rates of each test solution were calculated from the thickness loss and elapsed process time and are illustrated graphically in FIG. 1. Corrosion inhibitors A, B, C and D used in the screening process and their chemical structures are listed in Table 1.

TABLE 1

| Inhibitor | Chemical name | Structure |
|---|---|---|
| A | 1-Phenyl-1H-tetrazole-5-thiol | 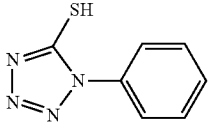 [SMILES: Sc1nnnn1-c1ccccc1] |
| B | Uric acid | 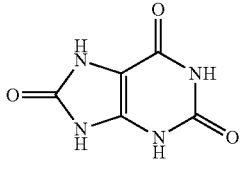 [SMILES: O=c1[nH]c(=O)c2[nH]c(=O)[nH]c2[nH]1] |
| C | Theophylline | 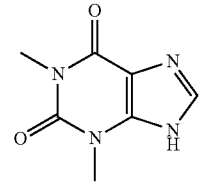 |
| D | Xanthine | 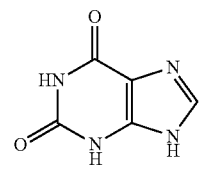 |

A primary requirement for corrosion inhibitors is to reduce or eliminate copper loss from the interconnects during the cleaning procedure. As shown in FIG. 1, corrosion inhibitors A, B, C and D were screened by measuring the copper etch rate. 'No inhibitor' indicates a commercially available copper post-CMP cleaner, EKC™ PCMP5600 which does not contain any corrosion inhibitor. A commonly used copper corrosion inhibitor, benzotriazole (BTA), was selected as a control. Inhibitors A and D most effectively suppressed copper etching, although inhibitors B and C also demonstrated satisfactory results.

Contact Angle—

Surface wettability on copper was estimated from contact angle. Contact angle measurement characterizes the interfacial tension between a solid and a liquid drop. The technique provides a simple method to generate a great amount of information for surface analysis.

Commercially available copper deposited silicon wafer coupons were cleaned with an acidic solution before contact angle measurements. The coupons were then immersed in cleaning solutions, rinsed with de-ionized water and dried in a nitrogen stream. The contact angle of the de-ionized water on the treated copper surface was measured using an automatic contact angle meter (DropMaster DM-701, Kyowa Interface Science Co., LTD).

Figure 2:
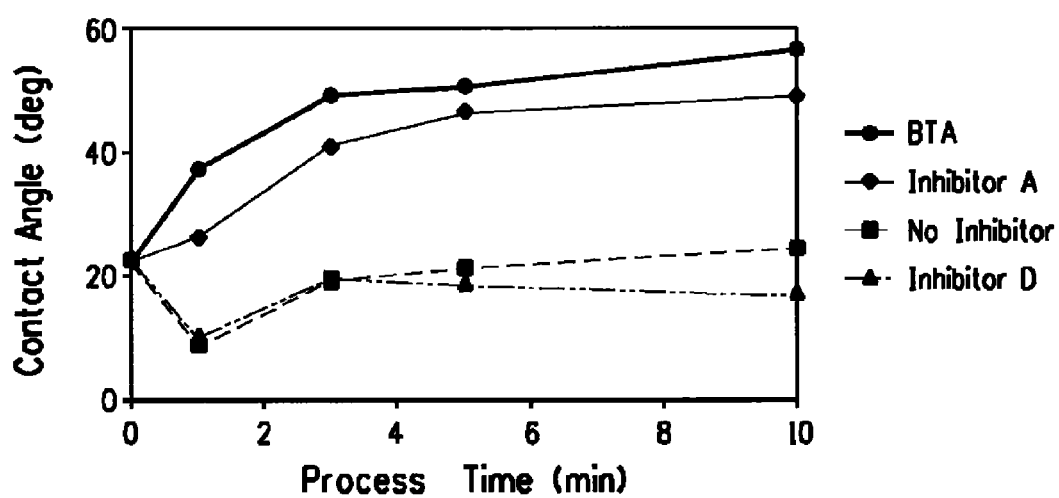
FIG. 2 is a graph depicting the contact angle of a water droplet on a copper surface that has been immersed in a cleaning solution from one to 10 minutes.

The contact angle of copper cleaned with the inhibitor containing solutions shown in FIG. 2 was measured to estimate surface hydrophobicity/hydrophilicity after cleaning and rinsing with de-ionized water. After several minutes it was observed that BTA formed a hydrophobic layer consistent with what has been reported in the literature. Inhibitor A also increased the contact angle, whereas inhibitor D and a commercial cleaner EKC™ PCMP5600, which does not contain any corrosion inhibitor, did not increase contact angle. This result suggests that inhibitor D (xanthine) does not remain on the copper surface, whereas BTA and inhibitor A (1-phenyl-1H-tetrazole-5-thiol) leave behind a hydrophobic film after rinsing. Based on the similarity of the molecular structures to inhibitor D, inhibitors B and C would be expected to perform as dynamic corrosion inhibitors similar to inhibitor D rather than similar to BTA.

Electrochemistry—

Electrochemical impedance spectroscopy was carried out on the test samples using a three-electrode configuration with a saturated Ag/AgCl reference electrode, a platinum wire counter electrode, and a working electrode made of a copper thin film deposited on a silicon wafer.

Figure 3A:
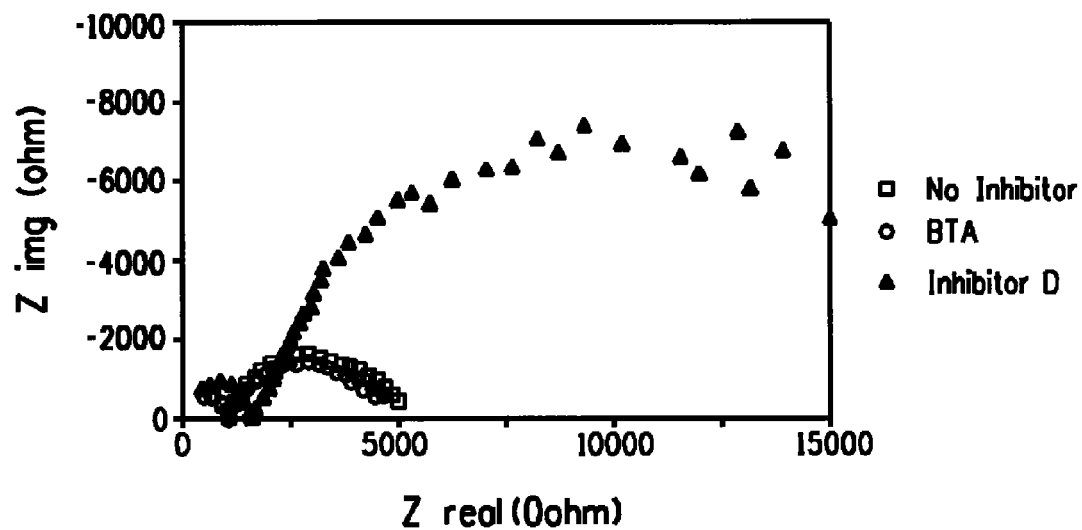
FIG. 3A is a graph depicting Nyquist plots obtained in solutions which contain different corrosion inhibitors.

Electrochemical impedance spectroscopy was used to investigate behavior of inhibitors, because it is a powerful technique to probe the solid-liquid interface. FIG. 3A is a graph depicting Nyquist plots obtained in solutions which contain different corrosion inhibitors. Semi-circles observed in electrochemical impedance spectra represent the charge transfer resistance between electrodes and solutions. A large semi-circle was observed for inhibitor D, which suggested it formed a thick and desirable electrochemical double layer at the interface between the copper electrode and the cleaning solution.

Figure 3B:
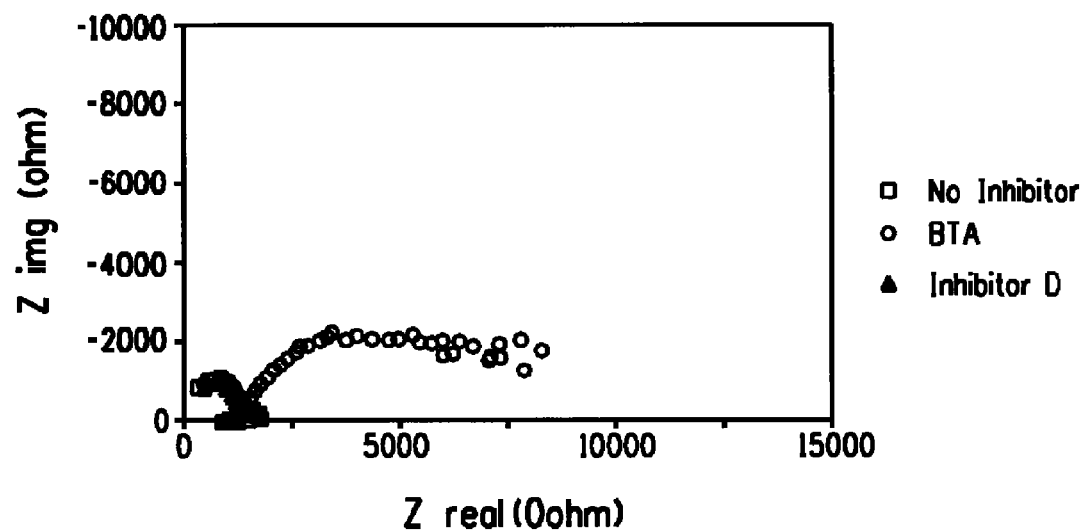
FIG. 3B is a graph depicting Nyquist plots obtained in an inert aqueous electrolyte solution with a copper electrode cleaned with cleaning solutions and rinsed with de-ionized water.

FIG. 3B is a graph depicting Nyquist plots obtained in an inert aqueous electrolyte solution with a copper electrode cleaned with cleaning solutions and rinsed with de-ionized water. The copper treated with, i.e., exposed to, BTA showed significant second semi-circles, which indicate that BTA still remained on the copper surface after rinsing. However, the copper electrode that had been cleaned with the no inhibitor solution and with the solution containing inhibitor D resulted in similar Nyquist plots after rinsing with de-ionized water. These results indicate that inhibitor D acts favorably as an inhibitor in cleaning solutions, but is readily removed by rinsing with de-ionized water.

Figure 4A:
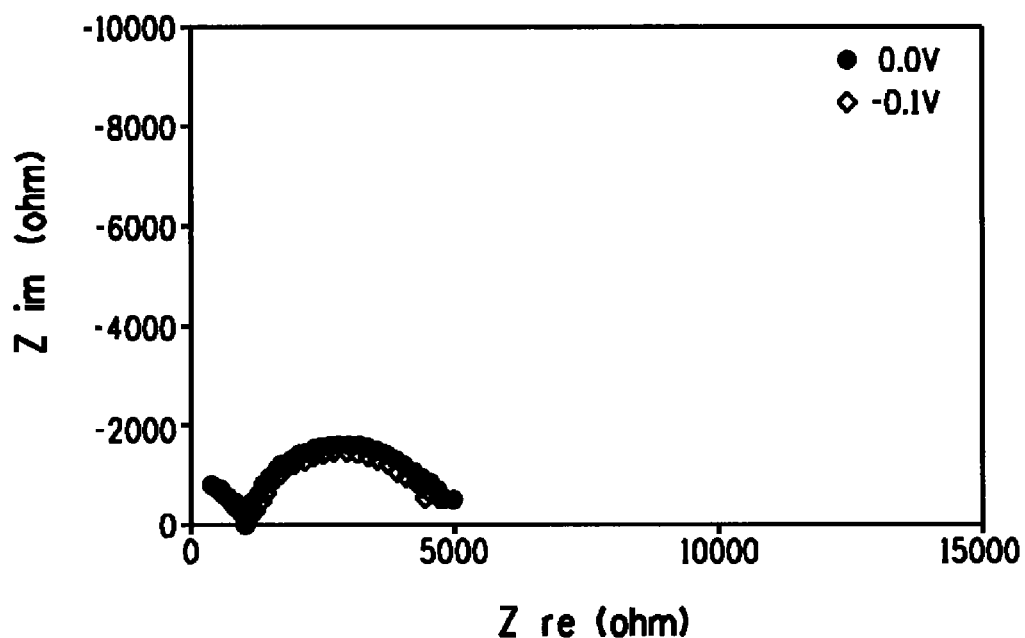
FIG. 4A is a graph depicting a Nyquist plot of a cleaning solution containing BTA with and without an applied potential.
Figure 4B:
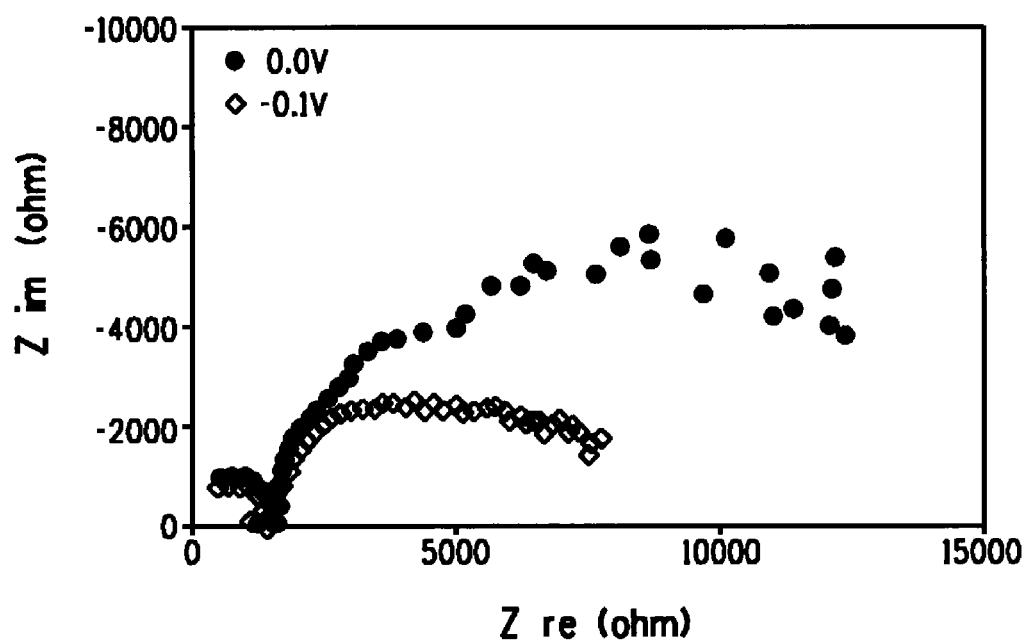
FIG. 4B is a graph depicting a Nyquist plot of a cleaning solution containing corrosion inhibitor D with and without an applied potential.

To further illustrate the behavior of inhibitor D molecules vs. BTA molecules and the copper surface, electrochemical impedance spectroscopy was performed with an intentionally applied potential. FIG. 4 is a graph which depicts Nyquist plots obtained in cleaning solutions containing (a) BTA and (b) inhibitor D with and without applied potential.

BTA did not show any change when negative potential (−100 mV) was applied between working and reference electrodes. This result suggests that a static chemical interaction exists between BTA molecules and the copper surface, meaning that a stable bonds exists between the BTA and the copper surface. On the other hand, the size of semi-circle of inhibitor D was markedly decreased by the negative applied potential. It is believed that application of a negative potential to the copper electrode tends to increase the amount of copper (0) and copper (I) species relative to copper (II) species at the surface of the electrode thereby affecting the tendency of inhibitor D to bond to the surface which, in turn, could account for the change in the electrochemical impedance spectra. Alternatively, changes in the electrostatic field produced by an applied potential would affect the concentration gradient of inhibitor D at the copper electrode surface, meaning that the concentration of inhibitor D on the surface would be lower and thereby cause the observed changes in the electrochemical impedance spectra.

CMP and Post-CMP Clean—

Commercially available Cu/ULK (SiOCH based low-k film, k~2.5) MIT patterned wafers were used for the cleaning test. ULK is an abbreviation for "Ultra Low-k". Typically, ULK is a dielectric material which has a k-value less than 2.5, whereas the k-value of a conventional dielectric material, e.g., $SiO_2$, is 3.9. The wafers were polished using a CMP wafer polisher with a standard polishing recipe. After polishing, the wafers were cleaned with the test formulations and rinsed with de-ionized water using a wafer scrubber system with a standard cleaning recipe. Defects on the patterned wafers were measured using ultraviolet illumination laser-scanning patterned wafer inspection and classified using an automatic defect review and characterization SEM.

Figure 5:
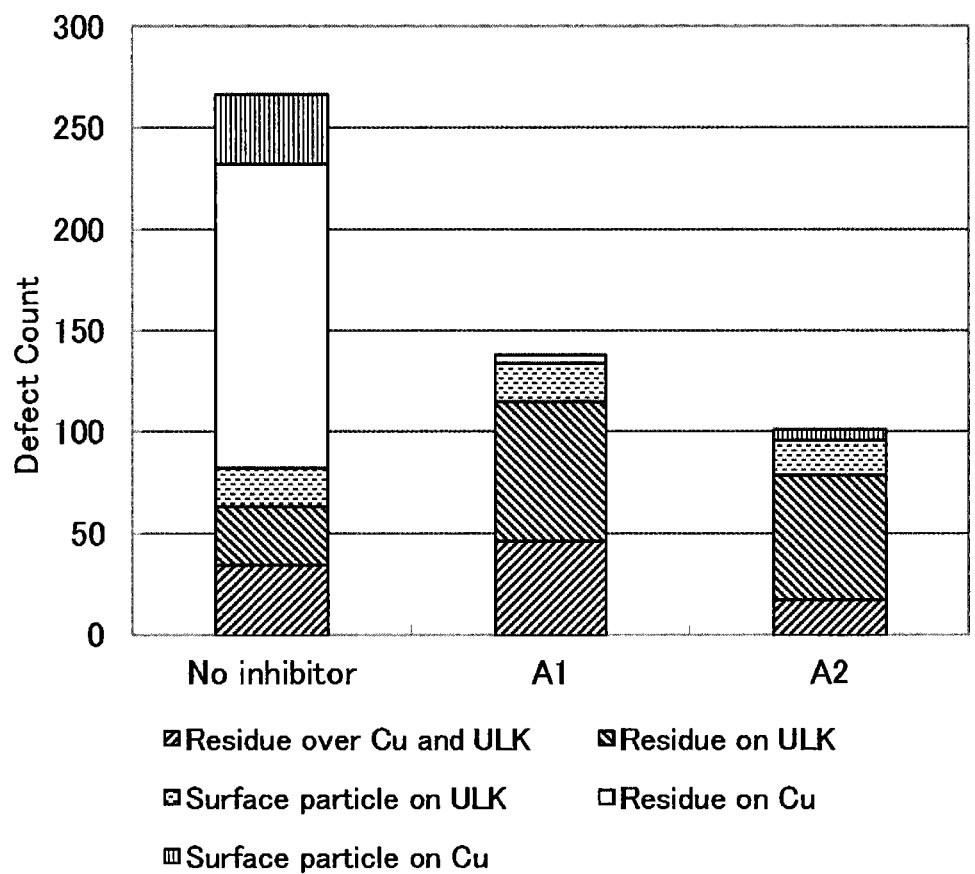
FIG. 5 is a graph which compares defects for Cu/ULK patterned wafers that have been cleaned with different post-CMP cleaning formulations.

When a corrosion inhibitor protects a copper surface during a cleaning process and leaves no detectable coating after a rinsing process, the number of copper related defects in the resulting semi-conductor device that are generated during the CMP and post-CMP cleaning processes is expected to be reduced. FIG. 5 is a graph which compares defects for Cu/ULK patterned wafers that have been cleaned with different post-CMP cleaning formulations. A commercial cleaner EKC™ PCMP5600 which does not contain any corrosion inhibitor, solutions A1 and A2 are cleaning solutions shown in Table 2 which contain inhibitor D.

TABLE 2

|  | A1 | A2 | A3 | A4 | A5 | A6 |
|---|---|---|---|---|---|---|
| Tris(2-hydroxyethyl)methyl ammonium hydroxide | 10.0 | 10.0 | 10.0 | 10.0 | 10.0 | 10.0 |
| N,N,N'-Trimethyl-N'-(2-hydroxyethyl)ethylenediamine | — | 5.0 | 5.0 | 5.0 | 5.0 | 5.0 |
| xanthine | 0.5 | 0.5 | — | — | — | 3.5 |
| Uric acid | — | — | 3.5 | — | — | — |
| Theophiline | — | — | — | 3.5 | — | — |
| Caffeine | — | — | — | — | 1.0 | — |
| Deionized water | 89.5 | 84.5 | 81.0 | 81.5 | 84.0 | 81.5 |

Compared with no inhibitor solution, EKC™ PCMP5600, solution A1, which contains 0.5 wt % xanthine as a corrosion inhibitor, reduced the number of surface particles remaining on the copper surface and any related residue to an almost undetectable level Solution A2 demonstrates the described and claimed inventive concept(s).

Experimental cleaning solutions A3, A4, A5 and A6 are shown in Table 2 which were formulated to contain uric acid, theophylline, caffeine and xanthine, respectively. Test wafers were cleaned for 10 minutes at room temperature with each test formulation and then rinsed with de-ionized water. Thereafter, copper etch rate (Å/min) was measured for each test wafer. Sample A3 with uric acid had an etch rate of less than 3 Å/min. Samples A4 and A5 with theophylline and xanthine, respectively, also had etch rates of less than 3 Å/min. Sample A6 with caffeine had a copper etch rate of less than 4 Å/min.

Changes may be made in the construction and the operation of the various components, elements and formulations described herein, and changes may be made in the steps or sequence of steps of the methods described herein without departing from the spirit and the scope of the invention as defined in the following claims.

What is claimed is:

1. An alkaline post-CMP aqueous cleaning composition for semiconductor devices having a copper interconnect thereon comprising at least:
   (A) from about 0.1 wt % to about 20 wt % N,N,N'-trimethyl-N'-(2-hydroxyethyl)ethylenediamine; and
   (B) from about 0.1 wt % to about 10 wt % of at least one corrosion inhibitor selected from the group consisting essentially of xanthine, theophyline, paraxanthine, theobromine, caffeine, guanine, hypoxanthine, adenine, and combinations thereof.

2. The cleaning composition of claim 1 further comprising from 0.01 wt % up to 20 wt % of tris(2-hydroxyethyl)methylammonium hydroxide.

3. The cleaning composition of claim 2 wherein said corrosion inhibitor is xanthine.

4. The cleaning composition of claim 3 wherein the pH is in the range of from about 8.5 to 13.

* * * * *